United States Patent
Zhang et al.

(10) Patent No.: US 11,898,712 B2
(45) Date of Patent: Feb. 13, 2024

(54) WHITE LIGHT EMITTING DEVICE, LIGHT BAR AND LIGHT APPARATUS

(71) Applicant: FOSHAN NATIONSTAR OPTOELECTRONICS CO., LTD., Guangdong (CN)

(72) Inventors: Jinhui Zhang, Guangdong (CN); Yikai Yuan, Guangdong (CN); Long Zhao, Guangdong (CN); Chuyi Li, Guangdong (CN); Cheng Li, Guangdong (CN)

(73) Assignee: FOSHAN NATIONSTAR OPTOELECTRONICS CO., LTD, Guangdong (CN)

(*) Notice: Subject to any disclaimer, the term of this patent is extended or adjusted under 35 U.S.C. 154(b) by 97 days.

(21) Appl. No.: 17/607,045

(22) PCT Filed: Dec. 12, 2019

(86) PCT No.: PCT/CN2019/124920
§ 371 (c)(1),
(2) Date: Oct. 28, 2021

(87) PCT Pub. No.: WO2020/220688
PCT Pub. Date: Nov. 5, 2020

(65) Prior Publication Data
US 2022/0214019 A1 Jul. 7, 2022

(30) Foreign Application Priority Data
Apr. 29, 2019 (CN) .......................... 201910356846.1

(51) Int. Cl.
*F21S 4/28* (2016.01)
*F21V 9/30* (2018.01)

(52) U.S. Cl.
CPC . *F21S 4/28* (2016.01); *F21V 9/30* (2018.02)

(58) Field of Classification Search
CPC ......... F21K 9/64; H01L 33/50; H01L 33/502; H01L 33/504
See application file for complete search history.

(56) References Cited

U.S. PATENT DOCUMENTS

| 9,888,537 B2 * | 2/2018 | Lee ....................... H01L 33/504 |
| 10,208,943 B2 * | 2/2019 | Allen ....................... F21K 9/64 |

(Continued)

FOREIGN PATENT DOCUMENTS

| CN | 101378105 A | 3/2009 |
| CN | 105782747 A | 7/2016 |

(Continued)

*Primary Examiner* — Andrew J Coughlin
(74) *Attorney, Agent, or Firm* — Gang Yu

(57) ABSTRACT

A white light emitting device, a light bar and a light apparatus. A relative spectrum of the white light emitting device is $\phi(\lambda)$. A relative spectrum of a black body radiation with a corresponding color temperature is $S(\lambda)$. An area normalization is performed on $\phi(\lambda)$ and $S(\lambda)$ to convert an equal energy spectrum $\phi'(\lambda)$ of the white light emitting device and an equal energy spectrum $S'(\lambda)$ of the black body radiation with the corresponding color temperature. A degree of similarity R of the equal energy spectrum of the white light emitting device and the equal energy spectrum of the black body radiation satisfies the following formula:

$$R = 1 - \frac{\sum_{\lambda i}^{\lambda n} |S'(\lambda) - \Phi'(\lambda)|}{\sum_{\lambda i}^{\lambda n} S'(\lambda)},$$

when $\lambda i$ is 380 nm, $\lambda n$ is 680 nm, R≥85%.

17 Claims, 2 Drawing Sheets

(56) References Cited

U.S. PATENT DOCUMENTS

| | | | |
|---|---|---|---|
| 11,320,100 B2* | 5/2022 | Lambooij | F21V 9/38 |
| 2004/0256974 A1* | 12/2004 | Mueller-Mach | C09K 11/7774 |
| | | | 313/485 |
| 2009/0184624 A1* | 7/2009 | Schmidt | C04B 37/001 |
| | | | 313/498 |
| 2011/0175520 A1* | 7/2011 | Ramer | F21K 9/64 |
| | | | 313/501 |
| 2013/0313516 A1* | 11/2013 | David | H01L 33/08 |
| | | | 257/89 |
| 2014/0009061 A1* | 1/2014 | Itoga | C09K 11/77342 |
| | | | 313/503 |
| 2014/0301062 A1* | 10/2014 | David | F21V 3/00 |
| | | | 362/84 |
| 2015/0062892 A1* | 3/2015 | Krames | F21K 9/235 |
| | | | 362/231 |
| 2015/0176777 A1* | 6/2015 | Hikmet | H01L 33/504 |
| | | | 362/84 |
| 2018/0139817 A1* | 5/2018 | Yamakawa | H05B 47/10 |
| 2019/0088833 A1* | 3/2019 | Itoga | H01L 33/50 |

FOREIGN PATENT DOCUMENTS

| | | |
|---|---|---|
| CN | 107437576 A | 12/2017 |
| CN | 107883199 A | 4/2018 |
| CN | 108091751 A | 5/2018 |
| CN | 108417695 A | 8/2018 |
| CN | 108954040 A | 12/2018 |
| CN | 208424845 U | 1/2019 |
| CN | 109346591 A | 2/2019 |
| CN | 109360821 A | 2/2019 |
| CN | 109538951 A | 3/2019 |
| CN | 110094641 A | 8/2019 |
| EP | 2962530 B1 | 5/2017 |
| EP | 3396712 A1 | 10/2018 |
| JP | 4363215 B2 | 11/2009 |

* cited by examiner

WHITE LIGHT EMITTING DEVICE, LIGHT BAR AND LIGHT APPARATUS

CROSS-REFERENCE TO RELATED APPLICATION

This application claims the priority of Chinese patent application No. 201910356846.1 entitled "White Light Emitting Device, Light Bar and Light Apparatus", filed on Apr. 29, 2019, which is incorporated in its entirety herein by reference.

TECHNICAL FIELD

The present disclosure relates to a technical field of light-emitting devices, and in particular to a white light emitting device capable of emitting light having a spectrum similar to the spectrum of sunlight, and a light bar and a light apparatus using the light emitting device.

BACKGROUND

As people's requirements for light quality increase, more and more application scenarios increase higher requirements for light colors of light-emitting devices. However, there is no uniform evaluation standard for sunlight-like products on the market. To make their spectra as close to the solar spectra as possible, some products known as sunlight-like products would output high-intensity spectral energy at wavelengths in the range of 440 nm-460 nm, even exceeding the range of a blue light hazard radiation curve; meanwhile, they have significant absence at wavelengths in the range of 460 nm-480 nm, making the spectrum discontinuous. These existing products can only have good degree of similarity in a wavelength range of 500 nm-620 nm with the sunlight, so they cannot actually become sunlight-like products.

SUMMARY

A white light emitting device is provided in the present technical solution. It is analyzed that a degree of similarity of a spectrum of the white light emitting device and a spectrum of sunlight are high, and the white light emitting device maintains the degree of similarity of above 90% in a visible light range (430 nm-650 nm) to prevent the problem of blue light glare.

The present disclosure is achieved through the following technical solutions.

A white light emitting device, wherein a relative spectrum of the white light emitting device is $\phi(\lambda)$, and a relative spectrum of a black body radiation with a corresponding color temperature is $S(\lambda)$, an area normalization is performed on $\phi(\lambda)$ and $S(\lambda)$ to convert an equal energy spectrum $\phi'(\lambda)$ of the white light emitting device and an equal energy spectrum $S'(\lambda)$ of the black body radiation with the corresponding color temperature, and then a degree of similarity R of the equal energy spectrum of the white light emitting device and the equal energy spectrum of the black body radiation satisfies the following formula:

$$R = 1 - \frac{\sum_{\lambda i}^{\lambda n} |S'(\lambda) - \Phi'(\lambda)|}{\sum_{\lambda i}^{\lambda n} S'(\lambda)}$$

wherein
$S'(\lambda) = S(\lambda)/k_1$
$k_1 = \Sigma_{430}^{650} S(\lambda)$
$\Phi'(\lambda) = \Phi(\lambda)/k_2$
$k_2 = \Sigma_{430}^{650} \Phi(\lambda)$
$R \geq 85\%$ when $\lambda i$ is 380 nm and $\lambda n$ is 680 nm.

In some embodiments, $R \geq 90\%$ when $\lambda i$ is 430 nm and $\lambda n$ is 650 nm, and more preferably, $R \geq 95\%$.

In some embodiments, $R \geq 80\%$ when $\lambda i$ is 465 nm and $\lambda n$ is 495 nm.

In some embodiments, the white light of the light emitting device is achieved by combining a blue chip, whose main emission peak is in the range of 380 nm-430 nm, with phosphors. The phosphors have a scheme consisting of three kinds of phosphors or a scheme consisting of four kinds of phosphors. For example, the phosphors are composed of a blue phosphor (having a main emission peak of 430 nm-500 nm and a full width at half maximum (FWHM) of 20 nm-100 nm), a green phosphor (having a main emission peak of 480 nm-550 nm and a FWHM of 20 nm-80 nm) and a red phosphor (having a main emission peak of 600 nm-700 nm and a FWHM of 80 nm-120 nm); or composed of a blue phosphor (having a main emission peak of 430 nm-500 nm and a FWHM of 20 nm-100 nm), a green phosphor (having a main emission peak of 480 nm-550 nm and a FWHM of 20 nm-80 nm), a yellow phosphor (having a main emission peak of 540 nm-600 nm and a FWHM of 60 nm-120 nm) and a red phosphor (having a main emission peak of 600 nm-700 nm and a FWHM of 80 nm-120 nm). Wherein the blue phosphor can be aluminate, chlorophosphate or silicate, specifically including $BaMgAl_{10}O_{17}:Eu^{2+}$, $BaAl_{12}O_9:Eu^{2+}$, $Sr_5(PO_4)_3Cl:Eu^{2+}$, $Ba_5(PO_4)_3Cl:Eu^{2+}$, $RbNa_3(Li_3SiO_4)_4:Eu^{2+}$ or $MgSr_3Si_2O_8:Eu^{2+}$; the green phosphor can be oxynitride, silicate or aluminate, specifically including $SiAlON:Eu^{2+}$, $BaSiON_2:Eu^{2+}$, $Ba_2SiO_4:Eu^{2+}$ or LuAG; the yellow phosphor can be aluminate, silicate or nitride, specifically including Ga-YAG, $Sr_2SiO_4:Eu^{2+}$, $(BaSr)_2SiO_4:Eu^{2+}$ or $La_3Si_6N_{11}:Ce^{3+}$; the red phosphor can be nitride, sulfide or fluoride, specifically including $CaAlSiN_3:Eu^{2+}$, $(Ca_{1-x}Sr_x)AlSiN_3:Eu^{2+}$, $Ca_2Si_5N_8:Eu^{2+}$, $Sr_2Si_5N_8:Eu^{2+}$, $Ba_2Si_5N_8:Eu^{2+}$, $CaS:Eu^{2+}$ or $MgGeF_6:Mn^{4+}$.

A light bar includes at least one white light emitting device as provided above, and a substrate for mounting and fixing the white light emitting device.

The white light emitting device or the light bar provided above can be mounted in a housing of a light apparatus and connected with other necessary circuit elements to form the light apparatus.

A white light emitting device is provided in the present technical solutions. The white light emitting device can maintain the degree of similarity of above 90% in the visible light range (430 nm-650 nm), as well as a low amplitude of fluctuation in spectra and excellent spectral continuity, such that a spectrum of the light apparatus of the disclosure approximates to the spectrum of the sunlight, thereby providing a user with good lighting effects and performing indoor activities with illumination resembling an outdoor environment.

DETAILED DESCRIPTION OF THE EMBODIMENTS

Figure 1:
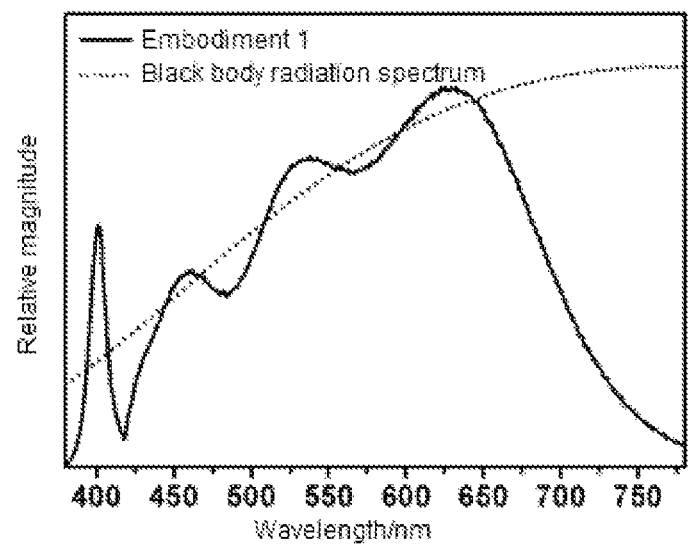
FIG. 1 is a comparison diagram of a relative spectrum of a white light emitting device described in Embodiment 1 and a relative spectrum of a black body radiation with the corresponding color temperature.

Hereinafter, the present disclosure will be further described in detail through specific implementations in conjunction with the accompany drawings. However, a person skilled in the art would understand that the following embodiments are only used to illustrate the present disclosure and should not be regarded as limiting the scope of the present disclosure. If a specific technique or condition is not indicated in the embodiments, the technique or condition shall be considered as a technique or condition described in literature in the field or in accordance with a product specification. Reagents or instruments used without an indication of a manufacturer are all conventional products that are commercially available.

A white light emitting device is provided in the present disclosure. A relative spectrum of the white light emitting device is $\phi(\lambda)$, and a relative spectrum of a black body radiation with the corresponding color temperature is $S(\lambda)$. An area normalization is performed on $\phi(\lambda)$ and $S(\lambda)$ to convert an equal energy spectrum $\phi'(\lambda)$ of the white light emitting device and an equal energy spectrum $S'(\lambda)$ of the black body radiation with the corresponding color temperature. A degree of similarity R of the equal energy spectrum of the white light emitting device and the equal energy spectrum of the black body radiation satisfy the following formula:

$$R = 1 - \frac{\sum_{\lambda i}^{\lambda n} |S'(\lambda) - \Phi'(\lambda)|}{\sum_{\lambda i}^{\lambda n} S'(\lambda)}$$

wherein
$S'(\lambda) = S(\lambda)/k_1$
$k_1 = \Sigma_{430}^{650} S(\lambda)$
$\Phi'(\lambda) = \Phi(\lambda)/k_2$
$k_2 = \Sigma_{430}^{650} \Phi(\lambda)$
$R \geq 85\%$ when $\lambda i$ is 380 nm and $\lambda n$ is 680 nm.

In some embodiments, $R \geq 90\%$ when $\lambda i$ is 430 nm and $\lambda n$ is 650 nm, and more preferably, $R \geq 95\%$.

In some embodiments, $R \geq 80\%$ when $\lambda i$ is 465 nm and $\lambda n$ is 495 nm.

In some embodiments, the white light of the light emitting device is achieved by combining a blue chip, whose main emission peak is in the range of 380 nm-430 nm, with phosphors. The phosphors have a scheme consisting of three kinds of phosphors or a scheme consisting of four kinds of phosphors. The phosphors are composed of a blue phosphor (having a main emission peak of 430 nm-500 nm and a FWHM of 20 nm-100 nm), a green phosphor (having a main emission peak of 480 nm-550 nm and a FWHM of 20 nm-80 nm) and a red phosphor (having a main emission peak of 600 nm-700 nm and a FWHM of 80 nm-120 nm); or composed of a blue phosphor (having a main emission peak of 430 nm-500 nm and a FWHM of 20 nm-100 nm), a green phosphor (having a main emission peak of 480 nm-550 nm and a FWHM of 20 nm-80 nm), a yellow phosphor (having a main emission peak of 540 nm-600 nm and a FWHM of 60 nm-120 nm) and a red phosphor (having a main emission peak of 600 nm-700 nm and a FWHM of 80 nm-120 nm). wherein the blue phosphor is aluminate, chlorophosphate or silicate, specifically including $BaMgAl_{10}O_{17}:Eu^{2+}$, $BaAl_{12}O_9:Eu^{2+}$, $Sr_5(PO_4)_3Cl:Eu^{2+}$, $Ba_5(PO_4)_3Cl:Eu^{2+}$, $RbNa_3(Li_3SiO_4)_4:Eu^{2+}$ or $MgSr_3Si_2O_8:Eu^{2+}$; the green phosphor is oxynitride, silicate or aluminate, specifically including $SiAlON:Eu^{2+}$, $BaSiON_2:Eu^{2+}$, $Ba_2SiO_4:Eu^{2+}$ or LuAG; the yellow phosphor is aluminate, silicate or nitride, specifically including Ga-YAG, $Sr_2SiO_4:Eu^{2+}$, $(BaSr)_2SiO_4:Eu^{2+}$ or $La_3Si_6N_{11}:Ce^{3+}$; the red phosphor is nitride, sulfide or fluoride, specifically including $CaAlSiN_3:Eu^{2+}$, $(Ca_{1-x}Sr_x)AlSiN_3:Eu^{2+}$, $Ca_2Si_5N_8:Eu^{2+}$, $Sr_2Si_5N_8:Eu^{2+}$, $Ba_2Si_5N_8:Eu^{2+}$, $CaS:Eu^{2+}$ or $MgGeF_6:Mn^{4+}$.

A light bar includes at least one white light emitting device as provided above, and a substrate for mounting and fixing the white light emitting device.

The white light emitting device or the light bar provided above can be mounted in a housing of a light apparatus and connected with other necessary circuit elements to form the light apparatus.

Embodiments 1-4

The white light emitting device emits the light when the phosphors are excited by an ultraviolet chip, wherein the phosphors are calculated in parts by weight and is a mixture of 55%-85% $BaMgAl_{10}O_{17}:Eu^{2+}$, 2%-15% $SiAlON:Eu^{2+}$, and 10%-35% $(Ca_{1-x}Sr_x)AlSiN_3:Eu^{2+}$.

The detailed proportions are as shown in Table 1.

TABLE 1

| Phosphors | Composition | Embodiment 1 | Embodiment 2 | Embodiment 3 | Embodiment 4 |
|---|---|---|---|---|---|
| Blue phosphor | $BaMgAl_{10}O_{17}:Eu^{2+}$ | 55% | 65% | 75% | 85% |
| Green phosphor | $SiAlON:Eu^{2+}$ | 10% | 5% | 15% | 2% |
| Red phosphor | $(Ca_{1-x}Sr_x)AlSiN_3:Eu^{2+}$ | 35% | 30% | 10% | 13% |

The white light emitting device is prepared according to the proportions shown in Embodiment 1. The relative spectrum $\phi(\lambda)$ of the white light emitting device and the relative spectrum $S(\lambda)$ of the black body radiation with the corresponding color temperature are shown in FIG. 1. The white light emitting device no longer has high-intensity spectral energy at wavelengths of 440 nm-460 nm, wherein a spectral peak herein is only slightly higher than the relative spectrum of the black body radiation with the corresponding color temperature. According to the degree of similarity formula of the equal energy spectrum of the white light emitting device and the equal energy spectrum of the black body radiation:

$$R = 1 - \frac{\sum_{\lambda i}^{\lambda n} |S'(\lambda) - \Phi'(\lambda)|}{\sum_{\lambda i}^{\lambda n} S'(\lambda)}$$

In combination with measured data, when $\lambda i$ is 380 nm and $\lambda n$ is 680 nm, R=87.9%; and, when $\lambda i$ is 430 nm and $\lambda n$ is 650 nm, R=93.8%. Meanwhile, a characteristic region of 465 nm-495 nm (that is, when $\lambda i$ is 465 nm and $\lambda n$ is 495 nm) can be converted to R=86.5%, which proves that the spectrum of the white light emitting device at wavelengths of 460 nm-500 nm is relatively continuous, approximating to an effect of natural light.

The white light emitting devices made with the proportions shown in Embodiment 2, Embodiment 3, and Embodiment 4 have a lighting effect similar to that of Embodiment 1. The relative spectrum $\phi(\lambda)$ of the product of each embodiment is measured separately, and in combination with the degree of similarity formula, meets the product requirements: when $\lambda i$ is 380 nm and $\lambda n$ is 680 nm, R≥85%; when $\lambda i$ is 430 nm and $\lambda n$ is 650 nm, R≥90%; and, when $\lambda i$ is 465 nm and $\lambda n$ is 495 nm, R≥80%.

Embodiments 5-8

The white light emitting device emits light when the phosphors are excited by an ultraviolet chip. The phosphors are calculated in parts by weight and is a mixture of 55%-85% $M_5(PO_4)_3Cl:Eu^{2+}$(M=Sr,Ba), 5%-20% $Ba_2SiO_4:Eu^{2+}$, 2%-15% Ga-YAG and 2%-10% $M_2Si_5N_8:Eu^{2+}$ (M=Ca,Sr,Ba). The detailed proportions are as shown in Table 2.

TABLE 2

| Phosphors | Composition | Embodiment 5 | Embodiment 6 | Embodiment 7 | Embodiment 8 |
|---|---|---|---|---|---|
| Blue phosphor | $M_5(PO_4)_3Cl:Eu^{2+}$(M = Sr, Ba) | 55% | 65% | 75% | 85% |
| Green phosphor | $Ba_2SiO_4:Eu^{2+}$ | 20% | 15% | 5% | 10% |
| Yellow phosphor | Ga-YAG | 15% | 12% | 10% | 2% |
| Red phosphor | $M_2Si_5N_8:Eu^{2+}$(M = Ca, Sr, Ba) | 10% | 8% | 10% | 3% |

Figure 2:
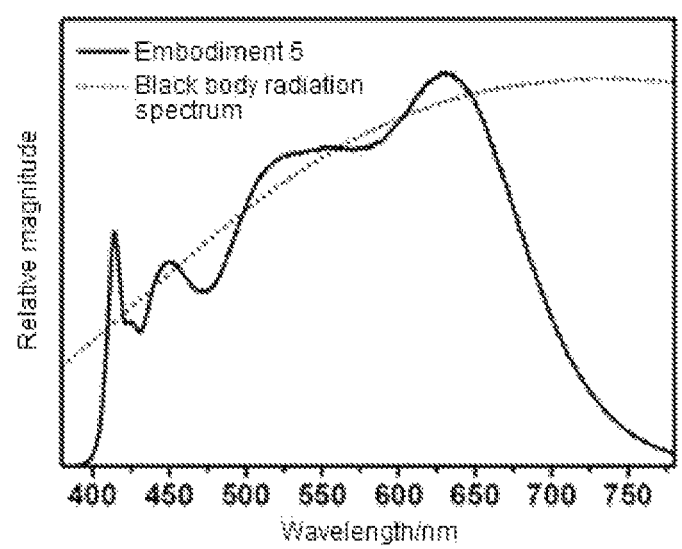
FIG. 2 is a comparison diagram of a relative spectrum of a white light emitting device described in Embodiment 5 and a relative spectrum of a black body radiation with the corresponding color temperature.

The white light emitting device is prepared according to the proportions shown in Embodiment 5. A contrast diagram of the relative spectrum $\phi(\lambda)$ of the white light emitting device and the relative spectrum $S(\lambda)$ of the black body radiation with the corresponding color temperature is as shown in FIG. 2. The white light emitting device no longer has high-intensity spectral energy at wavelengths of 440 nm-460 nm, wherein a spectral peak herein is only slightly higher than the relative spectrum of the black body radiation with the corresponding color temperature; while the spectrum of the white light emitting device at wavelengths of 460 nm-500 nm also becomes continuous. According to the degree of similarity formula of the equal energy spectrum of the white light emitting device and the equal energy spectrum of the black body radiation:

$$R = 1 - \frac{\sum_{\lambda i}^{\lambda n} |S'(\lambda) - \Phi'(\lambda)|}{\sum_{\lambda i}^{\lambda n} S'(\lambda)}$$

In combination with the measured data, when $\lambda i$ is 380 nm and $\lambda n$ is 680 nm, R=87.8%; and, when $\lambda i$ is 430 nm and $\lambda n$ is 650 nm, R=93.8%. Meanwhile, a characteristic region of 465 nm-495 nm (that is, when $\lambda i$ is 465 nm and $\lambda n$ is 495 nm) can be converted to R=83.7%, which proves that the spectrum of the white light emitting device at the wavelengths of 460 nm-500 nm is relatively continuous, approximating to an effect of natural light.

The white light emitting devices made with the proportions shown in Embodiment 6, Embodiment 7, and Embodiment 8 have a lighting effect similar to that of Embodiment 5. The relative spectrum $\phi(\lambda)$ of the product of each embodiment is measured separately, and in combination with the degree of similarity formula, meets the product requirements: when $\lambda i$ is 380 nm and $\lambda n$ is 680 nm, R≥85%; when $\lambda i$ is 430 nm and $\lambda n$ is 650 nm, R≥90%; and, when $\lambda i$ is 465 nm and $\lambda n$ is 495 nm, R≥80%.

Embodiments 9-12

The white light emitting device emits light when the phosphors are excited by an ultraviolet chip. The phosphors are calculated in parts by weight and is a mixture of 55%-70% $RbNa_3(Li_3SiO_4)_4:Eu^{2+}$, 5%-20% $Ba_2SiO_4:Eu^{2+}$, 2%-15% $La_3Si_6N_{11}:Ce^{3+}$ and 2%-10% $CaS:Eu^{2+}$. The detailed proportions are as shown in Table 3.

TABLE 3

| Phosphors | Composition | Embodiment 9 | Embodiment 10 | Embodiment 11 | Embodiment 12 |
|---|---|---|---|---|---|
| Blue phosphor | $RbNa_3(Li_3SiO_4)_4:Eu^{2+}$ | 70% | 65% | 60% | 55% |
| Green phosphor | $Ba_2SiO_4:Eu^{2+}$ | 17% | 15% | 20% | 20% |
| Yellow phosphor | $La_3Si_6N_{11}:Ce^{3+}$ | 5% | 15% | 10% | 15% |
| Red phosphor | $CaS:Eu^{2+}$ | 8% | 5% | 10% | 10% |

Figure 3:
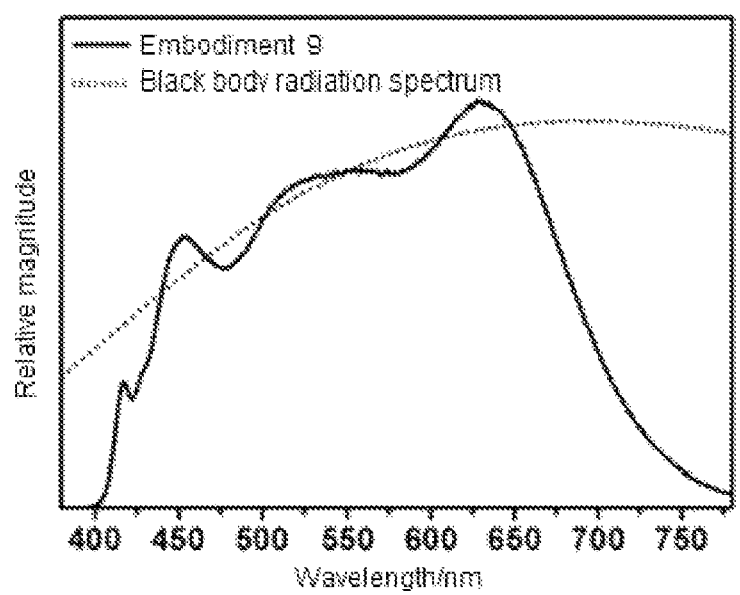
FIG. 3 is a comparison diagram of a relative spectrum of a white light emitting device described in Embodiment 9 and a relative spectrum of a black body radiation with the corresponding color temperature.

The white light emitting device is prepared according to the proportions shown in Embodiment 9. A contrast diagram of the relative spectrum $\phi(\lambda)$ of the white light emitting device and the relative spectrum $S(\lambda)$ of the black body radiation with the corresponding color temperature is as shown in FIG. 3. The white light emitting device no longer has high-intensity spectral energy at wavelengths of 440 nm-460 nm; while the spectrum of the white light emitting device at wavelengths of 460 nm-500 nm also becomes continuous. There is even no high-intensity ultraviolet spectral energy at wavelengths of 410 nm-420 nm. According to the degree of similarity formula of the equal energy spectrum of the white light emitting device and the equal energy spectrum of the black body radiation:

$$R = 1 - \frac{\sum_{\lambda i}^{\lambda n} |S'(\lambda) - \Phi'(\lambda)|}{\sum_{\lambda i}^{\lambda n} S'(\lambda)}$$

In combination with the measured data, when $\lambda i$ is 380 nm and $\lambda n$ is 680 nm, R=86.9%; and, when $\lambda i$ is 430 nm and $\lambda n$ is 650 nm, R=95.0%. Meanwhile, a characteristic region of 465 nm-495 nm (that is, when $\lambda i$ is 465 nm and $\lambda n$ is 495 nm) can be converted to R=93.0%, which proves that the spectrum of the white light emitting device at the wavelengths of 460 nm-500 nm approximates to the spectrum of natural light.

The white light emitting devices prepared with the proportions shown in Embodiment 10, Embodiment 11, and Embodiment 12 have a lighting effect similar to that of Embodiment 9. The relative spectrum $\phi(\lambda)$ of the product of each embodiment is measured separately, and in combination with the degree of similarity formula, meets the product requirements: when $\lambda i$ is 380 nm and $\lambda n$ is 680 nm, R≥85%; when $\lambda i$ is 430 nm and $\lambda n$ is 650 nm, R≥90%; and, when $\lambda i$ is 465 nm and $\lambda n$ is 495 nm, R≥80%.

What is claimed is:

1. A white light emitting device, wherein a relative spectrum of the white light emitting device is $\phi(\lambda)$, and a relative spectrum of a black body radiation with a corresponding color temperature is $S(\lambda)$, wherein an area normalization is performed on $\phi(\lambda)$ and $S(\lambda)$ to convert an equal energy spectrum $\phi'(\lambda)$ of the white light emitting device and an equal energy spectrum $S'(\lambda)$ of the black body radiation with the corresponding color temperature, and then a degree of similarity R of the equal energy spectrum of the white light emitting device and the equal energy spectrum of the black body radiation satisfies a following formula:

$$R = 1 - \frac{\sum_{\lambda i}^{\lambda n} |S'(\lambda) - \Phi'(\lambda)|}{\sum_{\lambda i}^{\lambda n} S'(\lambda)}$$

wherein
$S'(\lambda)=S(\lambda)/k_1$
$k_1=\Sigma_{430}^{650}S(\lambda)$
$\Phi'(\lambda)=\Phi(\lambda)/k_2$
$k_2=\Sigma_{430}^{650}\Phi(\lambda)$
R≥85% when $\lambda i$ is 380 nm and $\lambda n$ is 680 nm;
wherein the white light emitting device emits light when phosphors are excited by a chip with a main emission peak of 380 nm-430 nm, wherein the phosphors consist of a blue phosphor with a main emission peak of 430 nm-500 nm and a FWHM of 20 nm-100 nm, a green phosphor with a main emission peak of 480 nm-550 nm and a FWHM of 20 nm-80 nm, and a red phosphor with a main emission peak of 600 nm-700 nm and a FWHM of 80 nm-120 nm.

2. The white light emitting device as claimed in claim 1, wherein R≥90% when $\lambda i$ is 430 nm and $\lambda n$ is 650 nm.

3. The white light emitting device as claimed in claim 2, wherein R≥95% when $\lambda i$ is 430 nm and $\lambda n$ is 650 nm.

4. The white light emitting device as claimed in claim 1, wherein R≥80% when $\lambda i$ is 465 nm and $\lambda n$ is 495 nm.

5. The white light emitting device as claimed in claim 1, wherein the blue phosphor is aluminate, chlorophosphate or silicate, the green phosphor is on/nitride, silicate or aluminate; and the red phosphor is nitride, sulfide or fluoride.

6. The white light emitting device as claimed in claim 5, wherein the blue phosphor is $BaMgAl_{10}O_{17}:Eu^{2+}$, $BaAl_{12}O_9:Eu^{2+}$, $Sr_5(PO_4)_3Cl:Eu^{2+}$, $Ba_5(PO_4)_3Cl:Eu^{2+}$, $RbNa_3(Li_3SiO_4)_4:Eu^{2+}$ or $MgSr_3Si_2O_8:Eu^{2+}$.

7. The white light emitting device as claimed in claim 5, wherein the green phosphor is $SiAlON:Eu^{2+}$, $BaSiON_2:Eu^{2+}$, $Ba_2SiO_4:Eu^{2+}$ or LuAG.

8. The white light emitting device as claimed in claim 5, wherein the red phosphor is $CaAlSiN_3:Eu^{2+}$, $(Ca_{1-x}Sr_x)AlSiN_3:Eu^{2+}$, $Ca_2Si_5N_8:Eu^{2+}$, $Sr_2Si_5N_8:Eu^{2+}$, $Ba_2Si_5N_8:Eu^{2+}$, $CaS:Eu^{2+}$ or $MgGeF_6:Mn^{4+}$.

9. A light bar, comprising a substrate, wherein at least one white light emitting device as claimed in claim 1 is arranged on the substrate.

10. A light apparatus, comprising a housing, wherein the light bar as claimed in claim 9 is mounted in the housing.

11. A light apparatus, comprising a housing, wherein the white light emitting device as claimed in claim 1 is mounted in the housing.

12. A white light emitting device, wherein a relative spectrum of the white light emitting device is $\phi(\lambda)$, and a relative spectrum of a black body radiation with a corresponding color temperature is $S(\lambda)$, wherein an area normalization is performed on $\phi(\lambda)$ and $S(\lambda)$ to convert an equal energy spectrum $\phi'(\lambda)$ of the Mite light emitting device and an equal energy spectrum $S'(\lambda)$ of the black body radiation with the corresponding color temperature, and then a degree of similarity R of the equal energy spectrum of the white light emitting device and the equal energy spectrum of the black body radiation satisfies a following formula:

$$R = 1 - \frac{\sum_{\lambda i}^{\lambda n} |S'(\lambda) - \Phi'(\lambda)|}{\sum_{\lambda i}^{\lambda n} S'(\lambda)}$$

wherein
$S'(\lambda) = S(\lambda)/k_1$
$k_1 = \Sigma_{430}^{650} S(\lambda)$
$\Phi'(\lambda) = \Phi(\lambda)/k_2$
$k_2 = \Sigma_{430}^{650} \Phi(\lambda)$
R≥85% when λi is 380 nm and λn is 680 nm,
wherein the white light emitting device emits light when phosphors are excited by a chip with a main emission peak of 380 nm-430 nm, wherein the phosphors consist of a blue phosphor with a main emission peak of 430 nm-500 nm and a FWHM of 20 nm-100 nm, a green phosphor with a main emission peak of 480 nm-550 nm and a FWHM of 20 nm-80 nm, a yellow phosphor with a main emission peak of 540 nm-600 nm and a FWHM of 60 nm-120 nm, and a red phosphor with a main emission peak of 600 nm-700 nm and a FWHM of 80 nm-120 nm.

13. The white light emitting device as claimed in claim 12, wherein the blue phosphor is aluminate, chlorophosphate or silicate; the green phosphor is oxynitride, silicate or aluminate; the yellow phosphor is aluminate, silicate or nitride; and the red phosphor is nitride, sulfide or fluoride.

14. The white light emitting device as claimed in claim 13, wherein the yellow phosphor is Ga-YAG, $Sr_2SiO_4:Eu^{2+}$, $(BaSr)_2SiO_4:Eu^{2+}$ or $La_3Si_6N_{11}:Ce^{3+}$.

15. The white light emitting device as claimed in claim 13, wherein the blue phosphor is $BaMgAl_{10}O_{17}:Eu^{2+}$, $BaAl_{12}O_9:Eu^{2+}$, $Sr_5(PO_4)_3Cl:Eu^{2+}$, $Ba_5(PO_4)_3Cl:Eu^{2+}$, $RbNa_3(Li_3SiO_4)_4:Eu^{2+}$ or $MgSr_3Si_2O_8:Eu^{2+}$.

16. The white light emitting device as claimed in claim 13, wherein the green phosphor is $SiAlON:Eu^{2+}$, $BaSiON_2:Eu^{2+}$, $Ba_2SiO_4:Eu^{2+}$ or LuAG.

17. The white light emitting device as claimed in claim 13, wherein the red phosphor is $CaAlSiN_3:Eu^{2+}$, $(Ca_{1-x}Sr_x)AlSiN_3:Eu^{2+}$, $Ca_2Si_5N_8:Eu^{2+}$, $Sr_2Si_5N_8:Eu^{2+}$, $Ba_2Si_5N_8:Eu^{2+}$, $CaS:Eu^{2+}$ or $MgGeF_6:Mn^{4+}$.

* * * * *